(12) United States Patent
Coon

(10) Patent No.: US 7,745,079 B2
(45) Date of Patent: Jun. 29, 2010

(54) APPARATUS FOR AND METHOD OF THERMOPHORETIC PROTECTION OF AN OBJECT IN A HIGH-VACUUM ENVIRONMENT

(75) Inventor: Derek Coon, Redwood City, CA (US)

(73) Assignee: Nikon Corporation (JP)

( * ) Notice: Subject to any disclaimer, the term of this patent is extended or adjusted under 35 U.S.C. 154(b) by 1147 days.

(21) Appl. No.: 11/373,398

(22) Filed: Mar. 9, 2006

(65) Prior Publication Data

US 2007/0209226 A1 Sep. 13, 2007

(51) Int. Cl.
*G03C 5/00* (2006.01)
*G03B 27/52* (2006.01)
*F26B 5/04* (2006.01)
(52) U.S. Cl. .............................. 430/30; 355/30; 34/403
(58) Field of Classification Search ............... 430/5, 430/30; 355/53, 30; 34/403
See application file for complete search history.

(56) References Cited

U.S. PATENT DOCUMENTS

| 6,153,044 A | 11/2000 | Klebanoff et al. |
| 6,253,464 B1 | 7/2001 | Klebanoff et al. |
| 7,030,959 B2 * | 4/2006 | Sogard ........................ 355/30 |
| 7,367,138 B2 * | 5/2008 | Sogard ........................ 34/275 |

OTHER PUBLICATIONS

Gallis, M. A., et al., "Thermophoresis in Rarefied Gas Flows," *Aerosol Science and Technology*, 36: 1099-1117, 2002.
Dedrick, Daniel E., et al., "Verification studies of thermophoretic protection for extreme ultraviolet masks," *J. Vac. Sci. Technol.*, B 23(1): 307-317, Jan./Feb. 2005.

\* cited by examiner

*Primary Examiner*—Stephen Rosasco
(74) *Attorney, Agent, or Firm*—Finnegan, Henderson, Farabow, Garrett & Dunner, LLP

(57) ABSTRACT

Embodiments disclosed herein relate to an apparatus for and method of protecting a reticle in a lithography system from particle deposition using thermophoresis, but still allowing a high vacuum area for the photo-optics.

13 Claims, 9 Drawing Sheets

(2-2)

(5-5)

(7-7)

APPARATUS FOR AND METHOD OF THERMOPHORETIC PROTECTION OF AN OBJECT IN A HIGH-VACUUM ENVIRONMENT

BACKGROUND

1. Technical Field

Embodiments disclosed herein relate to an apparatus for and method of protecting a reticle in a lithography system from particle deposition using thermophoresis, but still allowing a high vacuum area for the photo-optics.

2. Related art

Reticles in a conventional lithographic system are typically protected by a clear faceplate, called a pellicle, to cover and protect the pattern side of a reticle. Increases in circuit densities on wafers result in the need for shorter wavelengths, e.g., $\lambda \approx 11\text{-}14$ nm (nominally 13 nm). With the shorter wavelength radiation, the pellicle cannot be utilized, as present materials absorb too much of the radiation for process efficiency and/or deteriorate quickly. Therefore, protecting the pattern side of a "pellicle-less" reticle from contamination while mounted on a reticle stage in a lithography system becomes important.

One alternative to a pellicle may be using a thermophoretic force, which relies on gas pressure and temperature gradients within the gas, to move particles from higher to lower temperature gas. The prior art describes at least one application of thermophoresis to protect lithography components such as wafers and reticles. A smaller enclosure around the reticle, which is maintained at a higher pressure than the vacuum environment in the larger enclosure surrounding the smaller enclosure can provide thermophoretic protection. In the prior art, the wall of the smaller enclosure opposite the downward facing, horizontal surface of the reticle has an aperture through which the gas flows out.

In the prior art, when elevated pressure is maintained over the surface to be protected, the portion of the reticle to be exposed to a beam of radiation for use in wafer processing may not be presented in the high-vacuum environment desired for optimum use of short wavelength radiation. Accordingly, an alternative apparatus and approach for providing thermophoretic particle protection to a reticle while in use in a high vacuum environment is needed.

SUMMARY

As embodied and broadly described herein, embodiments consistent with the invention can include a particle deposition reduction system for an object, a method of cooling the environment of an object to be protected by thermophoresis, and a particle deposition reduction apparatus for a surface to be protected.

The system for protecting a surface of an object with a surface to be protected from particle deposition in a first plane, wherein the surface to be protected is at a first temperature, Tr, can include a chamber containing the object and maintained at a pressure, Pc. The chamber can include a shielding plate disposed in a second plane substantially parallel to the first plane, the shielding plate having an aperture opposite the surface to be protected. The shielding plate can include a plurality of ports disposed on the face of the shielding plate opposite the first plane, wherein two or more of the plurality of gas ports are adapted to emit gas substantially parallel between the first and second planes and away from the aperture, and at least one projection forming a low conductance seal with the surface to be protected, and preventing significant volumetric rates of gas from flowing out of the chamber through the aperture. The system can also include a gas supply at a pressure, Ps, in a range from about 2.5 to about 4 times, Pc, connected to two or more of the plurality of gas ports, wherein the higher pressure gas accelerates away from the aperture and, after expanding and cooling to a temperature Tg<Tr, cools the space between the object and the shielding plate.

A method of cooling the environment of an object to be protected by thermophoresis according to some embodiments of the invention can include emitting gas at high pressure, Ps, into a chamber maintained at a lower pressure, Pc, wherein the gas's temperature on expansion may be modeled by the ideal gas law, PV=nRT. A particle deposition reduction apparatus for a surface to be protected according to some embodiments of the invention can include and object having a surface to be protected from particle deposition in a first plane and coupled to a stage for linear motion between two walls, a shielding plate disposed in a second plane substantially parallel to the first plane, one or more gas ports near the aperture, and one or more second projections coupled to the stage close to the object and extending toward the shielding plate.

The shielding plate has an aperture opposite the surface to be protected and can include a first projection around the aperture extending toward the surface to be protected, wherein a low conductance seal is formed between the first projection and the surface to be protected, a face of the first projection opposing one of the two walls is spaced a sufficient distance away to provide a fluid passageway for gas, and a low conductance seal is formed between the one or more second projections and the shielding plate and between the one or more second projections and one of the two walls and between the one or more second projections and the other one of the two walls.

Further, the object to be protected, the shielding plate, the two walls, the first projection, and the at least one second projection define a space to be filled with gas and maintained at a pressure sufficient to provide thermophoretic forces on particles near the surface to be protected.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments consistent with some embodiments of the invention and together with the description, serve to explain the principles of the invention. In the drawings.

DETAILED DESCRIPTION

Reference will now be made in detail to exemplary embodiments consistent with the invention, which are illustrated in the accompanying drawings. Wherever possible, the same reference numbers will be used throughout the drawings to refer to the same or like parts.

Two criteria of thermophoresis are a temperature gradient and having gas at a sufficient pressure present to establish a stable temperature gradient in the gas. The surface to be protected must be at a temperature greater than its surroundings. Heating the surface to be protected or cooling the surrounding surfaces and environment, or some combination of the two may establish the temperature difference to create the temperature gradient in the gas.

Figure 1:
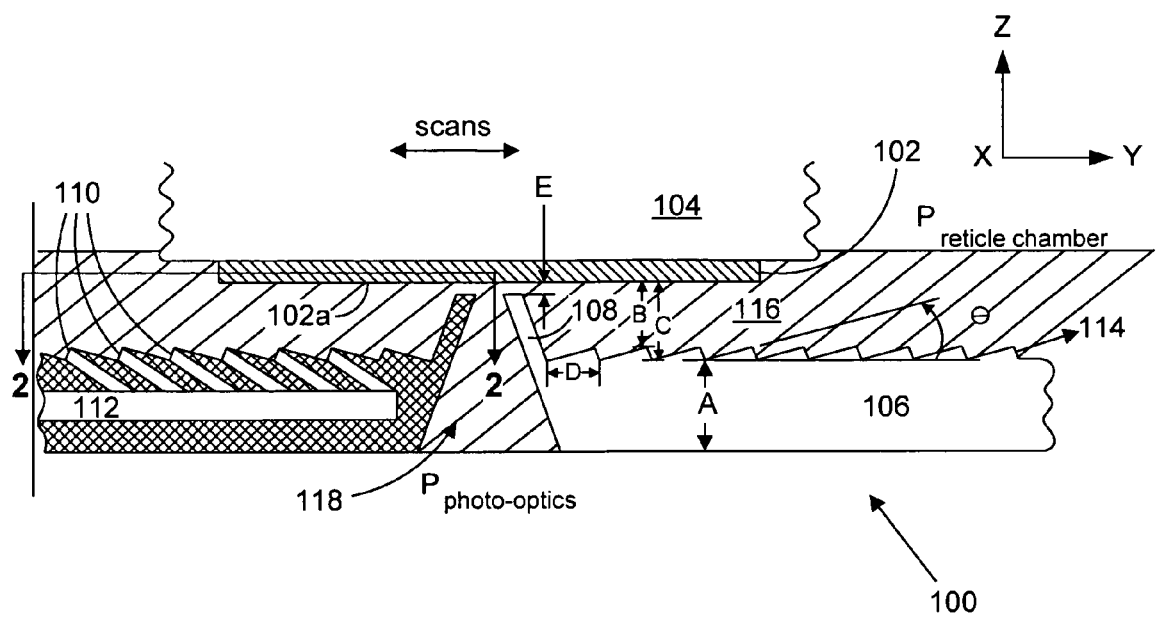
FIG. 1 illustrates a cross sectional view in the Y-Z plane of an apparatus consistent with some embodiments of the invention for providing thermophoretic protection to the reticle surface through use of high pressure gas jets positioned near the surface to be protected.

FIG. 1 illustrates an apparatus for providing sufficient pressure gas for establishing a temperature gradient and a method of cooling the environment of the surface to be protected. A reticle 102 with downward-facing, patterned side 102a is coupled to reticle stage 104, via a chuck (not shown, but well known to one skilled in the art). In a plane parallel to and below patterned surface 102a, reticle shielding plate 106 is disposed. In some embodiments, reticle shielding plate 106 is made of two parts, illustrated in FIG. 1 as a left part and a right part, separated by a slit. In some embodiments, reticle shielding plate 106 may include connecting structure on one or both sides of the slit, and thus be one integral piece (e.g., shown in FIG. 6). Each part of reticle shielding plate 106 shown in FIG. 1 has a projection 108 or lip that extends towards patterned surface 102a of reticle 102. The horizontal opening defined in part by edges of projections 108 may function as an aperture 118 for irradiating radiation from below.

Figure 2:
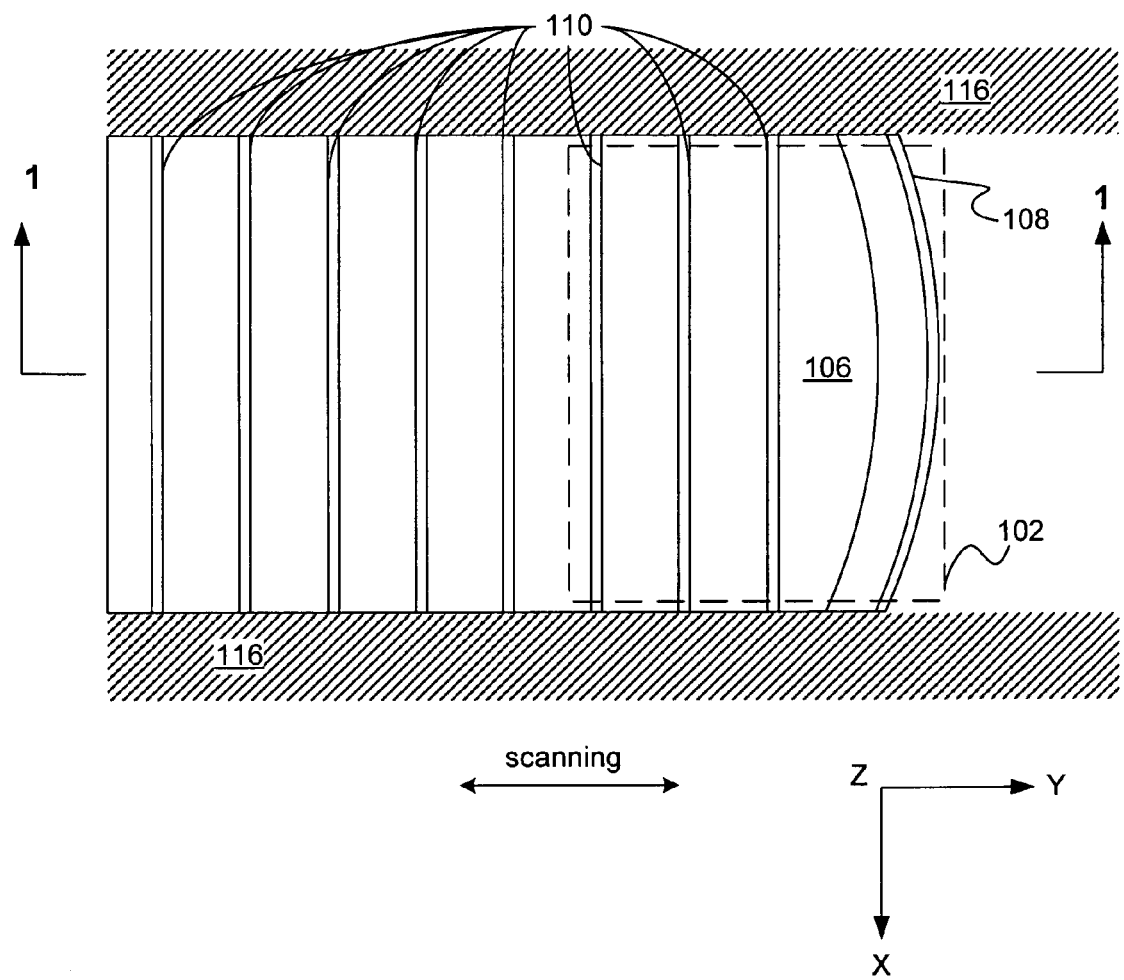
FIG. 2 illustrates a top view along lines 2-2 of the apparatus illustrated in FIG. 1.

Reticle shielding plate 106 also comprises multiple gas ports 110. In FIG. 1, the gas ports are the smaller faces of a saw tooth pattern on the surface of reticle shielding plate facing patterned surface 102a of reticle 102. In some embodiments, they emit gas the entire width of the reticle surface to be protected, as illustrated in FIG. 2. Non-limiting examples of porous materials suitable for constructing the gas ports include sintered metals (nickel, e.g.), or porous carbon, or micromesh filters where the holes are etched to less than 100 nm. Drilled holes, at least with conventional drill bits, are too large for the intended purpose. Shielding plate 106 may be made of non-porous materials, such as, for example, stainless steel, or if porous materials are used, it may be desirable to seal certain surfaces to direct the exiting gas. If non-porous materials are used, reticle shielding plate 106 must include piping or other gas passage ways 112 to supply gas from a constant pressure supply (not shown, but known to one skilled in the art) through reticle shielding plate 106 to gas ports 110. A requirement of the chosen material is that it not outgas. In FIG. 1, the thickness of reticle shielding plate 106 between a bottom point in the saw-tooth pattern of a top surface of reticle shielding plate 106 and its bottom planar surface is labeled with an "A." In some embodiments, A is between about 10 and about 20 mm.

If the supply gas pressure is much higher than the intended reticle chamber pressure, then the gas will expand as it exits gas ports 110, and proportionally cool according to the ideal gas law PV=nRT. Suitable gases include light molecular weight gases such as Helium and Argon (rare gas), and others that closely follow the ideal gas law. Accordingly, the expanded gas can provide the cooling necessary to produce a lower-temperature environment for the surface to be protected, as long as the surface to be protected retains a higher temperature than the cooled surrounding environment.

In some embodiments, the reticle chamber pressure is approximately 6.66 Pa and the supply gas pressure is from about 15 Pa to about 25 Pa. In some embodiments, the supply gas temperature is 275° K and drops 10° K upon expansion.

The gas also accelerates from the high pressure region to the lower pressure region, so ideally the gas flow is parallel to planar reticle surface 102a to prevent particles from being driven toward the surface to be protected, but substantially parallel flow (to the surface to be protected) will suffice. Substantially parallel flow may be obtained if the gas emitted from gas ports 110 exits at an angle θ of up to about 15 degrees away from the plane in which reticle shielding plate 106 is disposed.

An aspect of the invention is a method of purging particles near a surface to be protected from particle deposition. An embodiment of the method consistent with the invention includes emitting a gas at a high pressure into a chamber maintained at a lower pressure equal to or greater than 6.66 Pa, and emitting the gas substantially parallel to a surface to be protected from particle deposition. Upon accelerating from high pressure to the lower chamber pressure during expansion, the gas moves particles in its path away from the surface to be protected.

In certain embodiments, gas ports 110 are about 10 mm away from the plane containing the reticle surface to be protected. In the saw tooth embodiment illustrated in FIGS. 1 and 2, the highest point of gas port 110 is a distance B away from the plane containing the surface to be protected, and the lowest point of gas port 110 is a distance C away from the same plane, and the angle that the non-emitting surface forms with horizontal is theta, θ. In some embodiments, B is about 10 mm, and C is about 12 mm, and theta is about 15 deg.

Embodiments having more than one gas port on a side of projection 108, offer greater protection from particle deposition. In FIG. 1, the distance between gas ports is depicted as D. In some embodiments, D is about 10 mm. The spacing, D, of gas ports, however, may vary depending on the chosen geometry. For example, the smaller the angle theta, the further apart gas ports 110 will be in a saw-tooth pattern. Reticle 102 scans in the Y direction, and, thus, gas ports may be disposed up to a full reticle length beyond projection 108, in order to emit gas over much of patterned surface 102a of reticle 102 when the reticle perimeter is near aperture 118 and therefore most of reticle 102 extends in the Y direction to one side or the other of aperture 118.

As depicted in FIGS. 1 and 2, left and right parts of reticle shielding plate 106 abut two walls 116 and together form a "trench" or "channel" in the Y direction in which reticle 102 sits and scans back and forth. These walls 116 may assist in maintaining flow directed away from aperture 118 formed between projections 108 flowing substantially in the Y direction. In addition to the gas accelerating away from aperture 118 by disposition of gas ports 110, aperture 118 may have a low conductance seal around its perimeter located between an upper face of projection 108 and reticle patterned surface 102a to prevent gas from flowing anywhere but into aperture 118. The pressure in the reticle chamber may be maintained by a vacuum (not shown, but well known in the art).

The vertical opening, or gap "E", defined in part by an upper face of projections 108 and patterned surface 102a may function as a low conductance seal for gases present near reticle 102, preventing any significant volumetric flow of gas out of aperture 118 and/or particles from migrating in from the photo optics region. A pressure difference may be maintained when E is from about zero (no gap, which may be undesirable due to contact with the surface to be protected) to less than 2 mm. Preferably, E is from about 1 to about 1.5 mm, and more preferably about 1 mm. In some embodiments, the vertical distance "E" between an upper face of projection 108 and patterned surface 102a is about 1 mm. Accordingly, aperture 118 formed in part by the opposing edges of left and right projections 108 does not function as an outlet for gas flow. Such a low conductance seal also permits the size of aperture to vary independent of the desired pressure within the reticle chamber for thermophoretic protection.

Figure 3:
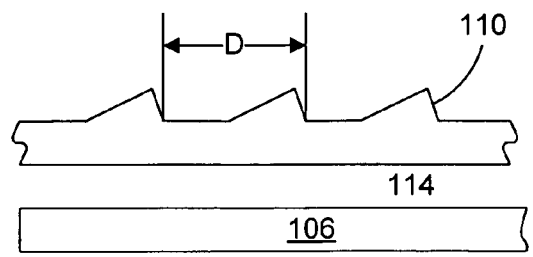
FIG. 3 illustrates multiple gas ports consistent with some embodiments of the invention in the same cross sectional view in the Y-Z plane as in FIG. 1.

Alternate geometries of the surface of shielding plate 106, as well as gas ports 110 may be envisioned. An example of an alternate geometry is shown in the partial cross section illustrated in FIG. 3.

Another approach to providing thermophoretic protection to the reticle while in use in a high vacuum environment is to maintain a much smaller volume of high pressure gas near the reticle surface to be protected in addition to providing a low conductance seal around the aperture. This may be accomplished by projections 120 that extend downward from reticle stage 104 on each side of reticle 102 that is perpendicular to the direction of scanning into the "trench", as illustrated in a Y-Z cross-section view in FIG. 4. As reticle stage 104 translates reticle 102 to the left and right, projections 120, or "sweepers" as they are sometimes called, may create moving boundaries for the high pressure region 122 for thermophoresis. In some embodiments, a bottom face of a sweeper 120 extends to about 1 mm away from the top surface of reticle shielding plate 106. When the gap "F" between a bottom face of sweeper 120 and a top surface of reticle shielding plate 106 is between zero and less than 2 mm, it may create a low conductance seal, effectively preventing gas flow and maintaining the pressure differential, just like the gap "E" between projections 108 and reticle surface 102a, described in connection with FIGS. 1 and 2. If the sides of sweeper 120 that face walls 116 are spaced with a gap "G" of greater than zero and less than about 2 mm (shown in FIGS. 5 and 6) they, too, may create a low conductance seal between the two surfaces.

Figure 4:
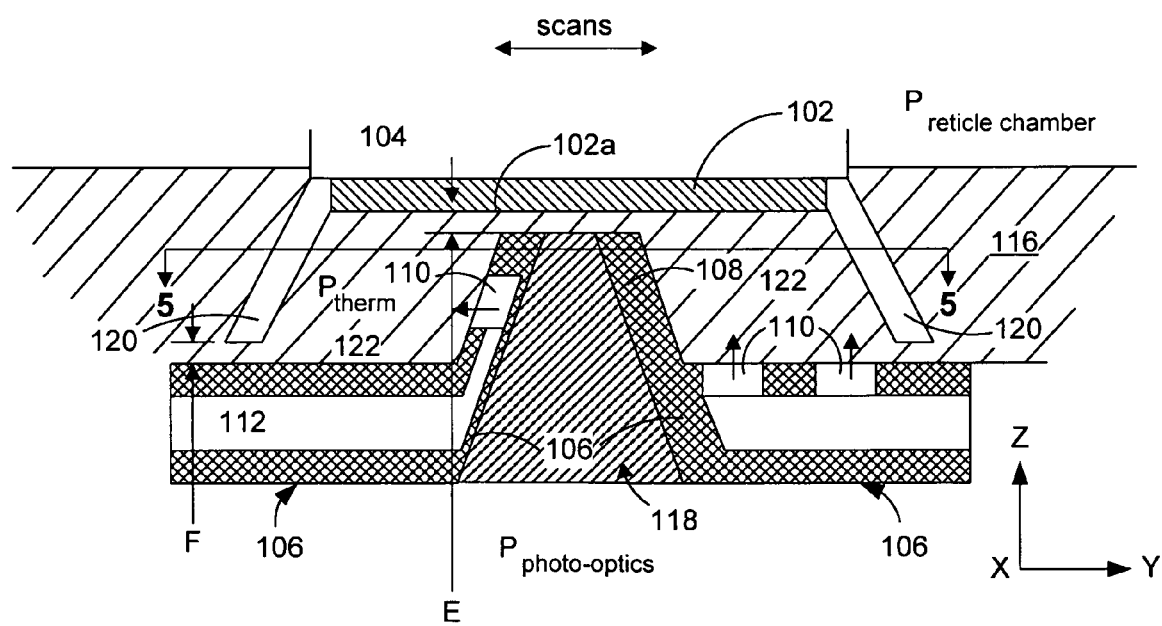
FIG. 4 illustrates a cross sectional view in the Y-Z plane of an apparatus consistent with some embodiments of the invention for maintaining a localized region of relatively high pressure gas for thermophoretic protection of a reticle during use in a high vacuum environment.
Figure 5:
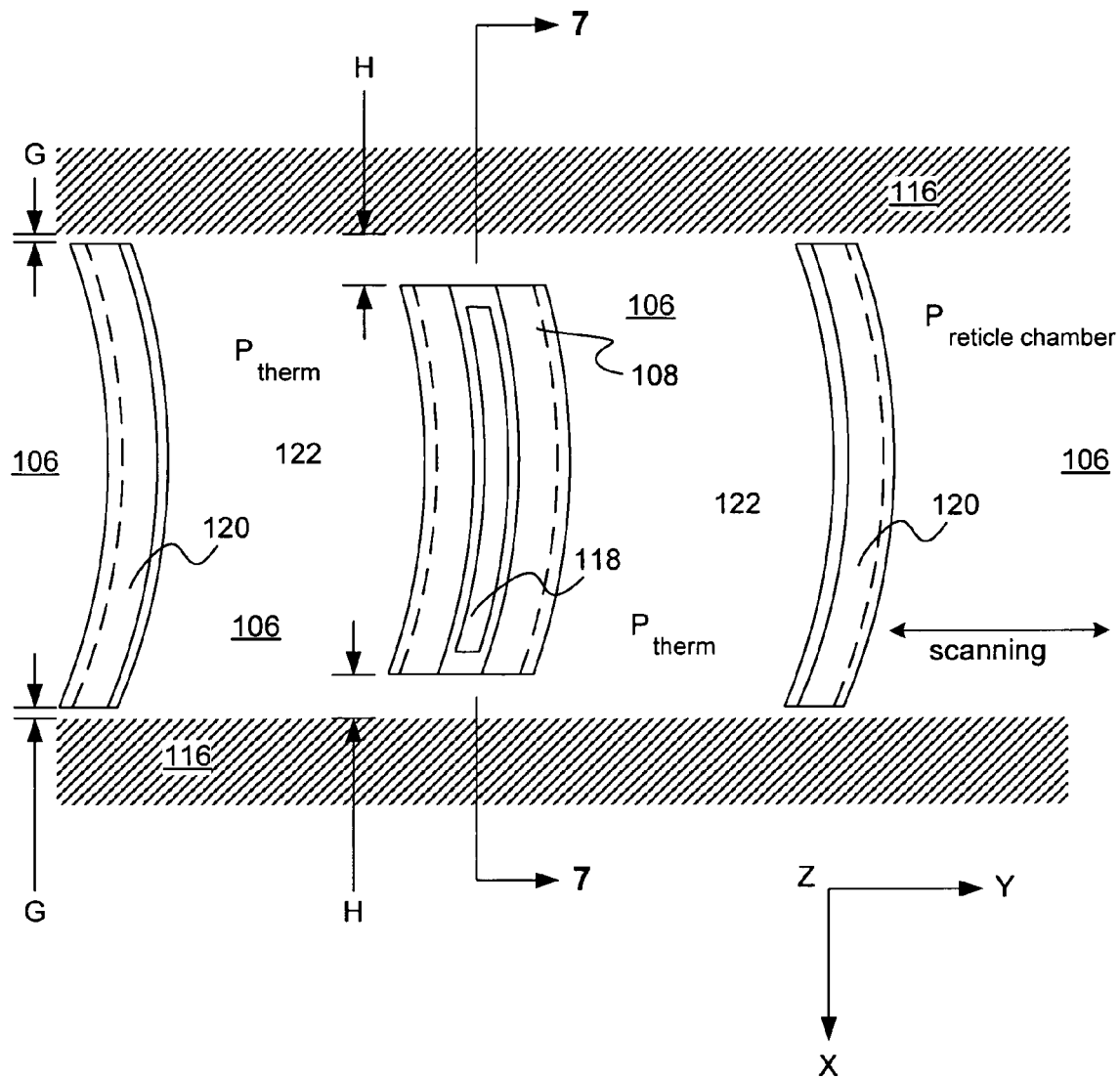
FIG. 5 illustrates cross-sectional view of the embodiment illustrated in FIG. 4, along the line 5-5 in FIG. 4 in the X-Y plane.
Figure 6:
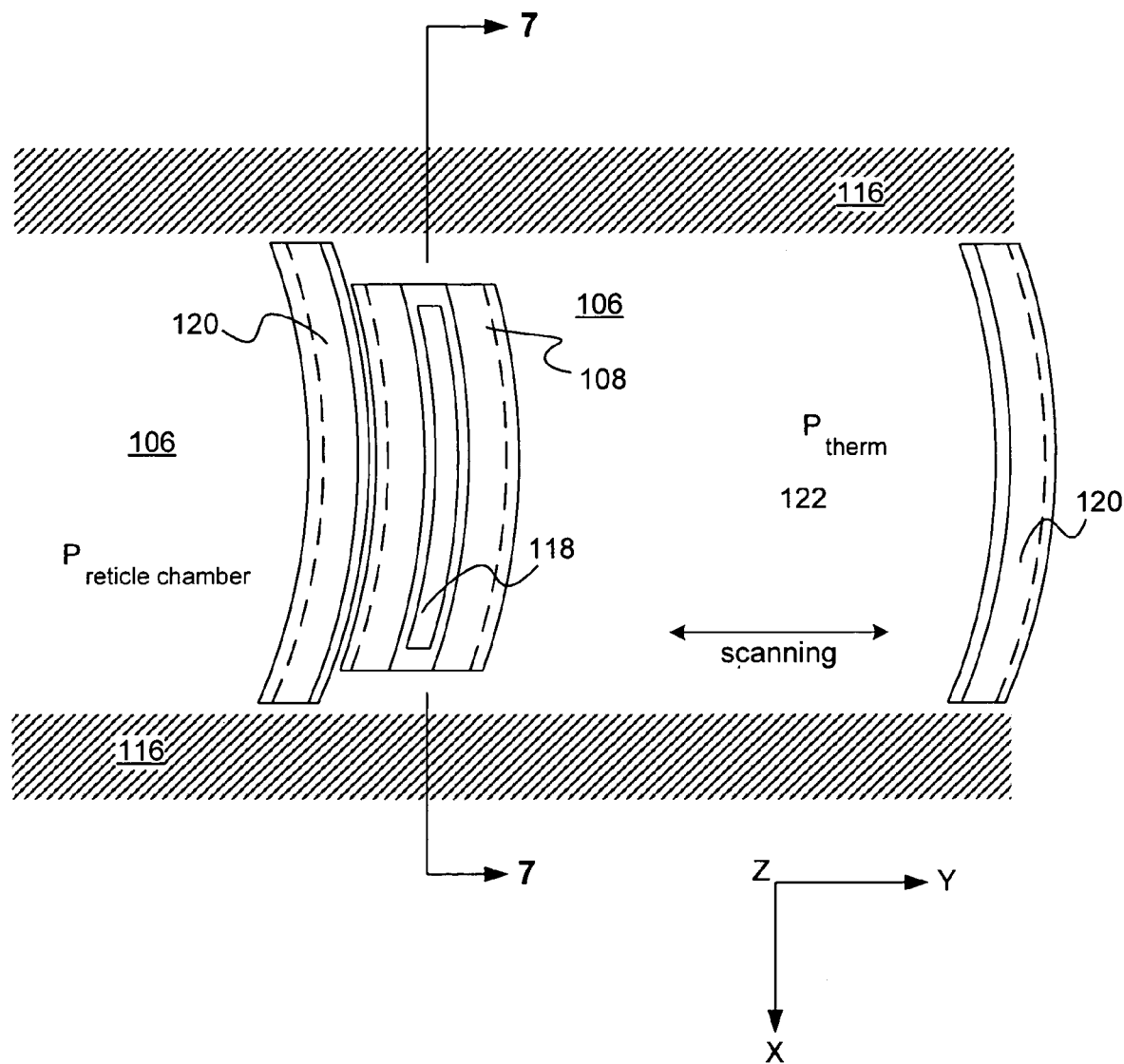
FIG. 6 illustrates the same view of the embodiment illustrated in FIG. 5, but when the reticle (not shown) has scanned to the right and the left sweeper almost abuts projection 108.

In embodiments with "sweepers," one or more passageways may be provided for the gas 122 to move past aperture 118 from the left to right or from right to left as reticle 102 is scanned in the Y direction. If walls 116 do not contact projections 108, then it may be desirable for reticle shielding plate 106 to be a single piece with one or more projections forming a continuous perimeter, at least a portion of which forms aperture 118. Such a configuration may prevent large volumetric flows of gas from flowing into aperture 118. In FIGS. 5 and 6, which are X-Y cross-sectional views along line 5-5 of FIGS. 4, and 7, which is an X-Z cross-sectional view along line 7-7 of FIG. 5, the distance between a wall 116 and an opposing face of projection 108 is illustrated as "H". In some embodiments, H is from about 5 mm to about 10 mm but can be narrower or wider depending on the selected thermophoretic pressure and the desired rate of flow from left to right or right to left.

In embodiments with "sweepers," a gas port 110 may be oriented in any particular direction, although parallel to the plane containing patterned surface 102a or reticle 102 is always desirable. FIG. 4 illustrates two exemplary locations of gas ports 110. In the left part of reticle shield 106, gas port 110 is in projection 108 and emits gas parallel to both the plane containing patterned surface 102a and top surface of reticle shielding plate 106. In the right part of reticle shield 106, two gas ports 110 are located in the top face of reticle shield 106 and emit gas towards patterned surface 102a. The gas need not be supplied at a significantly higher pressure than the selected thermophoretic pressure, and therefore does not significantly accelerate upon exiting the gas port as described in connection with FIGS. 1-3. In some embodiments, the supply pressure is the same as the thermophoretic pressure. In some embodiments, gas ports 110 supply only "replacement" gas to replace gas that leaks through the low conductance seals. As with the previous embodiments, top surface of reticle shield 106 is at least about 10 mm away from patterned surface 102a.

Sweepers 120 may take any shape and project at any angle as long as they form a low conductance seal with top surface of reticle shielding plate 106. In FIGS. 4-7, sweepers 120 match the contour of projection 108. This is best seen in FIGS. 5 and 6. Designing the shape of sweeper 120 to match the shape of projection 108 allows reticle 102 the greatest distance for scanning, and the smallest volume of high pressure gas for thermophoresis, because sweeper 120 may be mounted very near the reticle perimeter and come very close to projection 108 at all points, as seen in FIG. 6.

Figure 7:
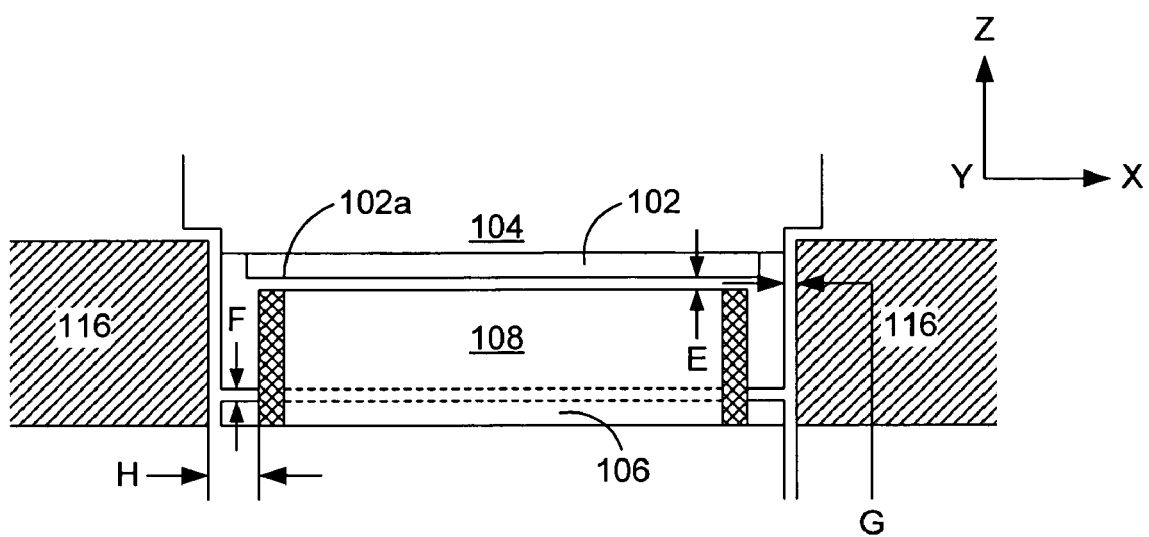
FIG. 7 illustrates an X-Z cross sectional view of the embodiment illustrated in FIG. 5, along line 7-7 of FIG. 5.

FIG. 7 best illustrates the channel or trench within which reticle 102 scans back and forth (in and out of the page). FIG. 7 also illustrates the low conductance seal formed by the gap "E" between an upper face of projection 108 and patterned surface 102a of reticle 102. The lower horizontal dashed line in projection 108 indicates the top surface of reticle shield 106, the higher horizontal dashed line in projection 108 indicates the bottom surface of sweeper 120, and the cross-hatched areas of projection 108 are the portions of projection 108 actually present in the plane of the cross section.

In each of the two previous embodiments (one: FIGS. 1 & 2; two: FIGS. 4-7) the aperture, formed by either projections 108 and channel walls 116 or projection 108 alone, does not function as a gas outlet. Accordingly, the pressure over patterned surface 102a opposite the aperture interferes much less, if at all, with the beam of radiation used in the lithography process, and is much closer to the high vacuum pressure of the photo-optics chamber (not shown but well known in the art). In some embodiments, the photo-optics chamber pressure is about 0.666 Pa, or one tenth of the high pressure regions for thermophoresis. As a result, this portion of reticle surface 102a is not protected by thermophoresis during exposure.

While it may be possible to use sweepers and high pressure gas ports in conjunction, generally such a combination may have problems, as the sweepers would likely interfere with the expansive gas flow. And the interference would make it difficult to establish a stable temperature gradient between the reticle surface to be protected and the surrounding environment. In some embodiments, like the one depicted in FIGS. 4-7, the particles are driven by thermophoretic forces into the reticle shielding plate and remain there.

Figure 8:
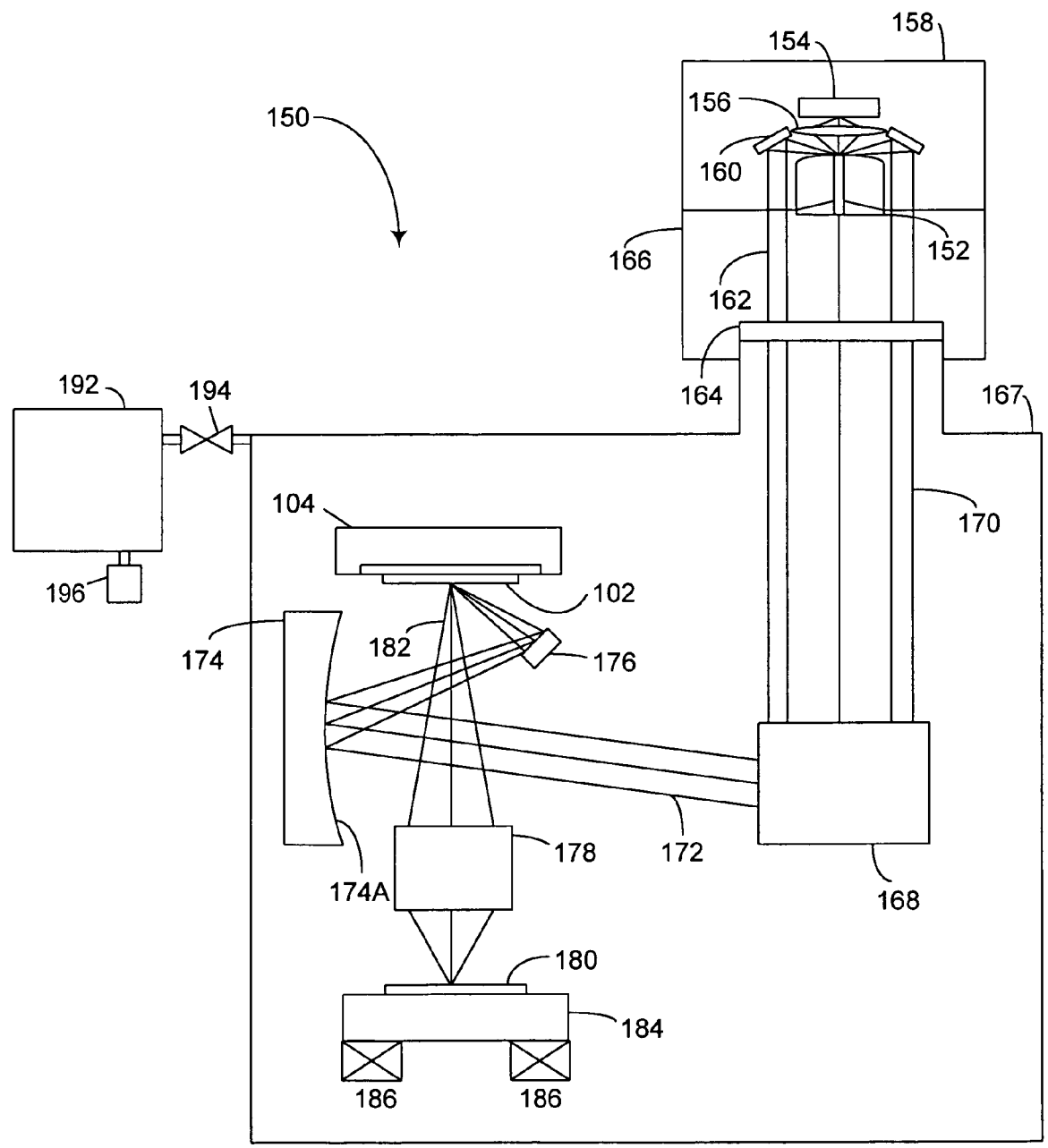
FIG. 8 illustrates a lithography system for use with some embodiments of the invention.

The present inventions may find use in several aspects of wafer processing. Referring to wafer processing equipment, FIG. 8 illustrates one example of an EUV (or soft-X-ray "SXR") lithographic exposure system 150. The depicted system is a projection-exposure system that performs step-andscan lithographic exposures using light in the extreme ultraviolet ("soft X-ray") band, typically having a wavelength in the range of $\lambda \approx 11\text{-}14$ nm (nominally 13 nm). Lithographic exposure involves directing an EUV illumination beam to a pattern-defining reticle 102. The illumination beam reflects from reticle 102 while acquiring an aerial image of the pattern portion defined in the illuminated portion of reticle 102. The resulting "patterned beam" is directed to an exposure-sensitive substrate, which upon exposure becomes imprinted with the pattern.

The EUV beam can be produced by a laser-plasma source 152 excited by a laser 154 situated at the most upper end of the depicted system 150. Laser 154 generates laser light at a wavelength within the range of near-infrared to visible. For example, laser 154 can be a YAG or an excimer laser, but other lasers can be used. Laser light emitted from laser 154 is condensed by a condensing optical system 156 and directed to downstream laser-plasma source 152.

A nozzle (not shown), disposed in laser-plasma light source 152, discharges xenon gas. As the xenon gas is discharged from the nozzle in laser-plasma light source 152, the gas is irradiated by the high-intensity laser light from the condensing optical system 156. The resulting intense irradiation of the xenon gas causes sufficient heating of the gas to generate a plasma. Subsequent return of Xe molecules to a low-energy state results in the emission of SXR (EUV) radiation with good efficiency having a wavelength of approximately 13 nm.

Since EUV light has low transmissivity in air, its propagation path preferably is enclosed in a vacuum environment produced in a vacuum chamber 158. Also, since debris tends to be produced in the environment of the nozzle from which the xenon gas is discharged, vacuum chamber 158 desirably is separate from other chambers of system 150.

A paraboloid mirror 160, provided with, for example, a surficial multi-layer Mo/Si coating, can be disposed relative to laser-plasma source 152 so as to receive EUV light radiating from laser plasma source 152 and to reflect the EUV light in a downstream direction as a collimated beam 162. The multi-layer film on parabolic mirror 160 can be configured to have high reflectivity for EUV light of which $\lambda$=approximately 13 nm.

Collimated beam 162 passes through a visible-light-blocking filter 164 situated downstream of parabolic mirror 160. By way of example, filter 164 can be made of beryllium (Be), with a thickness of about 0.15 nm. Of the EUV radiation 162 reflected by parabolic mirror 160, only the desired 13 nm wavelength of radiation passes through filter 164. Filter 164 can be contained in a vacuum chamber 166 evacuated to high vacuum.

An exposure chamber 167 can be situated downstream of pass filter 164. Exposure chamber 167 contains an illumination-optical system 168 that comprises at least a condenser-type mirror and a fly-eye-type mirror (not shown, but well understood in the art). Illumination-optical system 168 also can be configured to shape EUV beam 170 (propagating from filter 164) to have an arc-shaped transverse profile. Shaped "illumination beam" 172 can be irradiated toward the left in FIG. 8 and can be received by mirror 174.

Mirror 174 has a circular, concave reflective surface 174A, and can be held in a vertical orientation (in the figure) by holding members (not shown). Mirror 174 can be formed from a substrate made, e.g., of quartz or low-thermal-expansion material such as Zerodur (Schott). Reflective surface 174A can be shaped with extremely high accuracy and coated with a Mo/Si multi-layer film that can be highly reflective to EUV light. Whenever EUV light having a wavelength in the range of 10 to 15 nm is used, the multi-layer film on surface 174A can include a material such as ruthenium (Ru) or rhodium (Rh). Other candidate materials are silicon, beryllium (Be), and carbon tetraboride ($B_4C$).

A bending mirror 176 may be disposed at an angle relative to mirror 174, and is shown to the right of mirror 174 in FIG. 8. Reflective reticle 102, that defines a pattern to be transferred lithographically to a substrate, may be situated "above" bending mirror 176. Note that reticle 102 may be oriented horizontally with a reflective surface directed downward to avoid deposition of any debris on a patterned surface of reticle 102. Reticle 102 may be further protected from particle deposition through one or more apparatuses or methods of thermophoresis protection consistent with the invention. Illumination beam 172 of EUV light emitted from illumination-optical system 168 may be reflected and focused by mirror 174, and reaches the reflective surface of reticle 102 via bending mirror 176.

Reticle 102 typically has an EUV-reflective surface configured as a multi-layer film. Pattern elements, corresponding to pattern elements to be transferred to the substrate (or "wafer"), can be defined on or in the EUV-reflective surface. Reticle 102 can be mounted via a reticle chuck (not shown) on a reticle stage 104 that may be operable to hold and position reticle 102 in at least the X- and Y-axis directions as required for proper alignment of reticle 102 relative to the substrate for accurate exposure. Reticle stage 104 can, in some embodiments, be operable to rotate reticle 102 as required about the Z-axis. The position of reticle stage 104 may be detected interferometrically in a manner known in the art. Hence, illumination beam 172 reflected by bending mirror 176 may be incident at a desired location on the reflective surface of reticle 102.

A projection-optical system 178 and substrate 180 can be disposed downstream of reticle 102. Projection-optical system 178 can include several EUV-reflective mirrors and apertures. Patterned beam 182 from reticle 102, carrying an aerial image of the illuminated portion of reticle 102, can be "reduced" (demagnified) by a desired factor (e.g., ¼) by projection-optical system 178 and may be focused on the surface of substrate 180, thereby forming an image of the illuminated portion of the pattern on substrate 180. So as to be imprintable with the image carried by patterned beam 182, the upstream-facing surface of the substrate 180 can be coated with a suitable resist.

Reticle 102 as mounted on reticle stage 104 may be separated by the various structures and gas flow as described with respect to FIGS. 2-8 from projection-optical system 178.

As previously described, substrate 180 may be mounted by suction or other appropriate mounting force via a substrate "chuck" (not shown but well understood in the art) a substrate stage 184. Substrate stage 184 may be configured to move substrate 180 in the X-direction, Y-direction, and theta Z (rotation about the Z axis) direction relative to the projection-optical system 178, in addition to the three vertical DOF. Desirably, substrate stage 184 may be mounted on and supported by vibration-attenuation devices 186. The position of the substrate stage 184 may be detected interferometrically, in a manner known in the art.

A pre-exhaust chamber 192 (load-lock chamber) may be connected to exposure chamber 167 by a gate valve 194. A vacuum pump 196 may be connected to pre-exhaust chamber 192 and serves to form a vacuum environment inside pre-exhaust chamber 192.

During a lithographic exposure performed using the system shown in FIG. 8, EUV light 172 may be directed by illumination-optical system 168 onto a selected region of the reflective surface of reticle 102. As exposure progresses, reticle 102 and substrate 180 are scanned synchronously (by their respective stages 104, 184) relative to projection-optical system 178 at a specified velocity ratio determined by the demagnification ratio of projection-optical system 178. Normally, because not all of the pattern defined by reticle 102 can be transferred in one "shot," successive portions of the pattern, as defined on reticle 102, are transferred to corresponding shot fields on substrate 180 in a step-and-scan manner. By way of example, a 25 mm×25 mm square chip can be exposed on substrate 180 with an IC pattern having a 0.07 µm line spacing at the resist on substrate 180.

Coordinated and controlled operation of system 150 may be achieved using a controller (not shown) coupled to various components of system 150 such as illumination-optical system 168, reticle stage 104, projection-optical system 178, and substrate stage 184. For example, the controller operates to optimize the exposure dose on substrate 180 based on control data produced and routed to the controller from the various components to which the controller may be connected, including various sensors and detectors (not shown).

Many of the components and their interrelationships in this system are known in the art, and hence are not described in detail herein.

As described above, a photolithography system according to the above described embodiments can be built by assembling various subsystems, including each element listed in the appended claims, in such a manner that prescribed mechanical accuracy, electrical accuracy and optical accuracy are maintained. In order to maintain the various accuracies, prior to and following assembly, every optical system may be adjusted to achieve its optical accuracy. Similarly, every mechanical system and every electrical system are adjusted to achieve their respective mechanical and electrical accuracies. The process of assembling each subsystem into a photolithography. system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment may be performed to make sure that every accuracy is maintained in the complete photolithography system. Additionally, it may be desirable to manufacture an exposure system in a clean room where the temperature and humidity are controlled.

Figure 9:
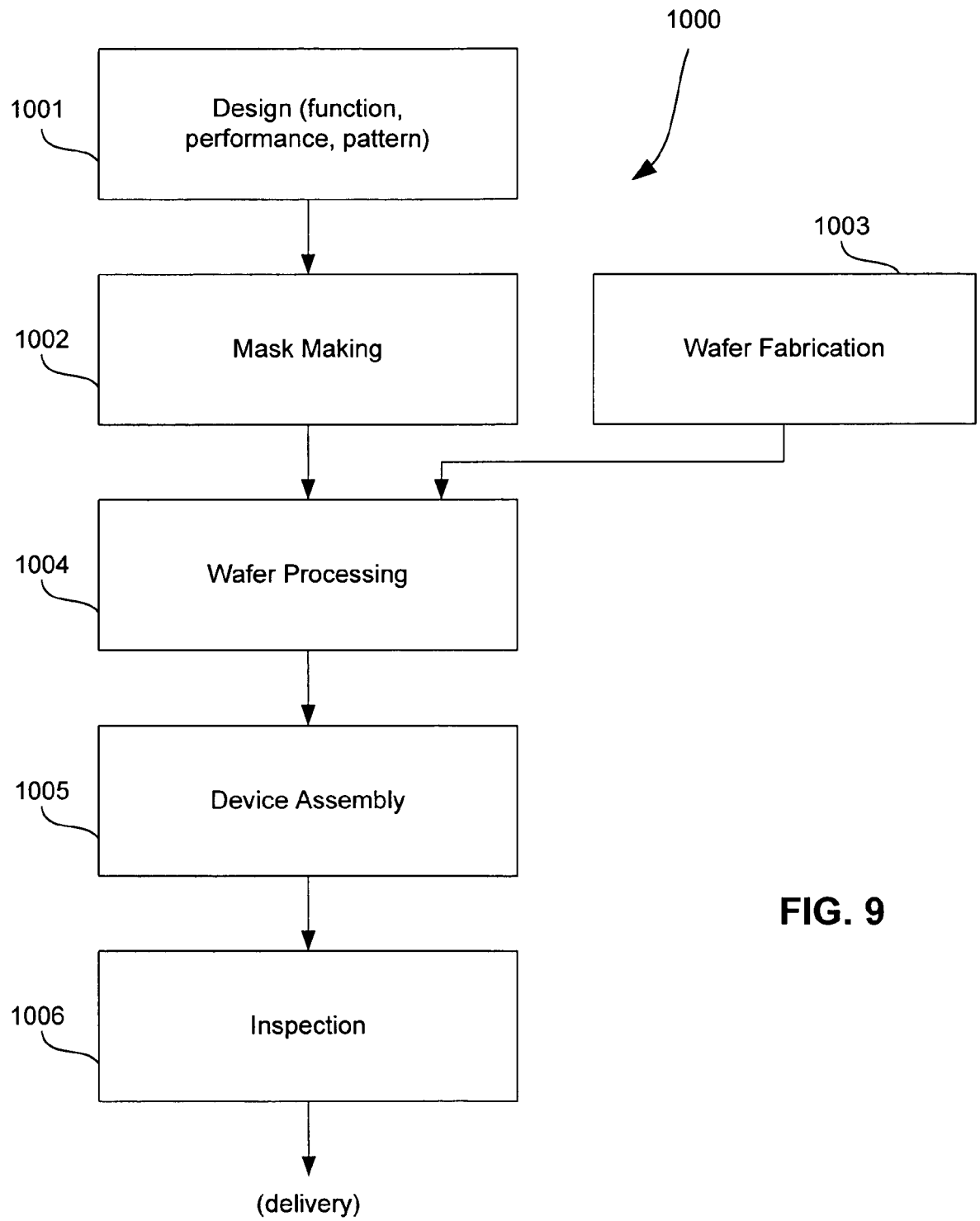
FIG. 9 illustrates a diagram of a process of fabricating semiconductor devices.

Further, semiconductor devices can be fabricated using the above-described systems, by process 1000 shown generally in FIG. 9. In step 1001, the device's function and performance characteristics are designed. Next, in step 1002, a mask (reticle) having a pattern designed according to the previous designing step is made. In a parallel step 1003, a wafer is made from a silicon material. The mask pattern designed in step 1002 may be exposed onto the wafer from step 1003 in step 1004 by a photolithography system described hereinabove consistent with the principles of the present invention. In step 1005, the semiconductor device may be assembled (including the dicing process, bonding process and packaging process), then finally the device may be inspected in step 1006.

Figure 10:
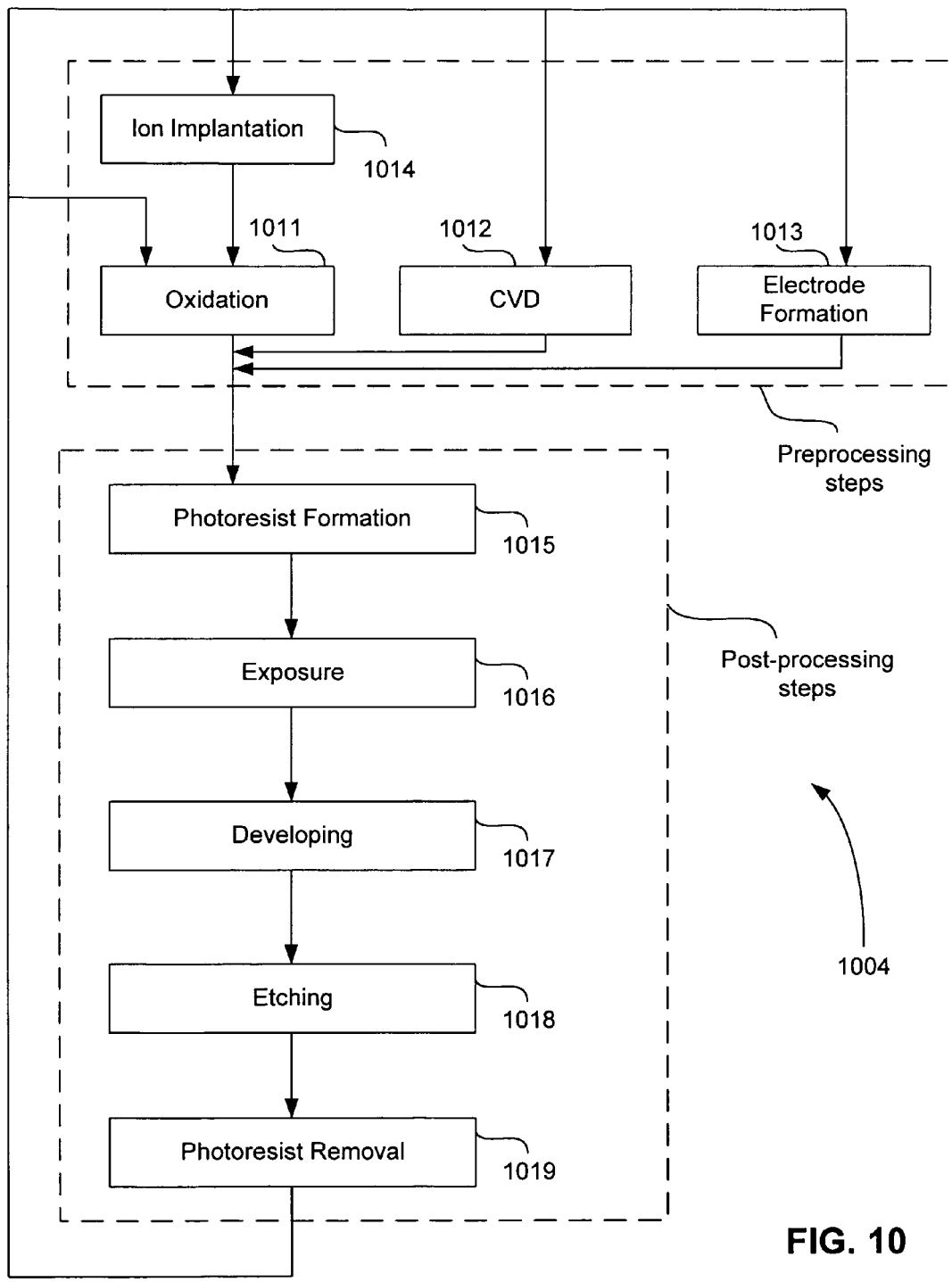
FIG. 10 illustrates a detailed flow diagram of step 1004 of the process shown in FIG. 9.

FIG. 10 illustrates a detailed flowchart example of the above-mentioned step 1004 in the case of fabricating semiconductor devices. In step 1011 (oxidation step), the wafer surface may be oxidized. In step 1012 (CVD step), an insulation film may be formed on the wafer surface. In step 1013 (electrode formation step), electrodes are formed on the wafer by vapor deposition. In step 1014 (ion implantation step), ions are implanted in the wafer. The above mentioned steps 1011-1014 form the preprocessing steps for wafers during wafer processing, and selection of specific steps and sequence of steps is done according to processing requirements.

At each stage of wafer processing, when the above-mentioned preprocessing steps have been completed, the following post-processing steps are implemented. During post-processing, initially, in step 1015 (photoresist formation step), photoresist is applied to a wafer. Next, in step 1016, (exposure step), the above-mentioned exposure device is used to transfer the circuit pattern of a mask (reticle) to a wafer. Then, in step 1017 (developing step), the exposed wafer is developed, and in step 1018 (etching step), parts other than residual photoresist (exposed material surface) are removed by etching. In step 1019 (photoresist removal step), unnecessary photoresist remaining after etching is removed.

Multiple circuit patterns are formed by repetition of these preprocessing and post-processing steps.

Other embodiments consistent with some embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A particle deposition reduction apparatus for an object comprising:
    an object with a surface to be protected from particle deposition in a first plane, wherein the surface to be protected is at a first temperature, Tr;
    a stage that scans a reticle; and
    a chamber containing the object and maintained at a pressure, Pc, wherein the chamber comprises:
        a shielding plate disposed in a second plane substantially parallel to the first plane, the shielding plate having an aperture opposite the surface to be protected, the shielding plate comprising:
            a plurality of gas ports disposed on the face of the shielding plate opposite the first plane, wherein two or more of the plurality of gas ports are adapted to emit gas substantially parallel between the first and second planes and away from the aperture, wherein at least one of the gas ports has a substantially slit-shape opening, which is substantially perpendicular to the scanning direction of the stage; and
            at least one projection forming a low conductance seal with the surface to be protected and preventing significant volumetric rates of gas from flowing out of the chamber through the aperture;
    a gas supply at a pressure, Ps, in a range from about 2.5 to about 4 times Pc, connected to two or more of the plurality of gas ports, wherein the higher pressure gas accelerates away from the aperture and, after expanding and cooling to a temperature Tg<Tr, cools the space between the object and the shielding plate.

2. The apparatus of claim 1, wherein two or more of the plurality of gas ports emit gas at an angle of up to about 15 degrees away from the second plane.

3. The apparatus of claim 1, wherein one or more of the plurality of gas ports comprises a micromesh, wherein the holes are etched up to 100 nm in diameter.

4. The apparatus of claim 1, wherein one or more of the plurality of gas ports comprises a sintered metal.

5. The apparatus of claim 1, wherein one or more of the plurality of gas ports comprises porous carbon.

6. The apparatus of claim 1, wherein Pc is about 6.66 Pa.

7. The apparatus of claim 1, wherein Ps is in a range from about 15 Pa to about 25 Pa.

8. The apparatus of claim 1, wherein Tg is about 10° K less than Tr.

9. A particle deposition reduction apparatus for a surface to be protected comprising:
- an object having a surface to be protected from particle deposition in a first plane and coupled to a stage for linear motion between two walls;
- a shielding plate disposed in a second plane substantially parallel to the first plane, the shielding plate having an aperture opposite the surface to be protected and comprising:
    - a first projection around the aperture extending toward the surface to be protected, wherein a low conductance seal is formed between the first projection and the surface to be protected and a face of the first projection opposing one of the two walls is spaced a sufficient distance away to provide a fluid passageway for gas; and
    - one or more gas ports near the aperture; and
- one or more second projections coupled to the stage close to the object and extending toward the shielding plate, wherein a low conductance seal is formed between the one or more second projections and the shielding plate and between the one or more second projections and one of the two walls and between the one or more second projections and the other one of the two walls,
- wherein the object to be protected, the shielding plate, the two walls, the first projection, and the at least one second projection define a space to be filled with gas and maintained at a pressure sufficient to provide thermophoretic forces on particles near the surface to be protected.

10. The apparatus of claim 9, wherein the one or more second projections coupled to the stage match the contour of a nearest portion of the first projection from the shielding plate.

11. The apparatus of claim 9, wherein the face of the projection opposing one of the two walls is spaced a distance between about 5 mm and about 10 mm from the wall.

12. The apparatus of claim 9, wherein the top of the shielding plate is at a distance of at least 10 mm from the surface to be protected.

13. The apparatus of claim 9, wherein the first and second projections are spaced less than 2 mm away from an opposing surface, thereby forming low conductance seals between the respective projection and the opposing surface.

* * * * *